United States Patent
Lin et al.

(10) Patent No.: US 11,626,304 B2
(45) Date of Patent: *Apr. 11, 2023

(54) MACHINE LEARNING ON OVERLAY MANAGEMENT

(71) Applicant: Taiwan Semiconductor Manufacturing Co., Ltd., Hsinchu (TW)

(72) Inventors: Tzu-Cheng Lin, Hsinchu (TW); Y. Y. Peng, Hsinchu (TW); Jerry Wang, Hsinchu (TW); Kewei Zuo, Hsinchu (TW); Chien Rhone Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/178,929

(22) Filed: Feb. 18, 2021

(65) Prior Publication Data
US 2021/0175105 A1 Jun. 10, 2021

Related U.S. Application Data

(63) Continuation of application No. 16/405,702, filed on May 7, 2019, now Pat. No. 10,964,566.

(60) Provisional application No. 62/692,208, filed on Jun. 29, 2018.

(51) Int. Cl.
G05B 19/19 (2006.01)
H01L 21/67 (2006.01)
G05B 13/02 (2006.01)
G03F 7/20 (2006.01)

(52) U.S. Cl.
CPC .... *H01L 21/67259* (2013.01); *G03F 7/70633* (2013.01); *G05B 13/027* (2013.01); *G05B 19/19* (2013.01); *G05B 2219/32335* (2013.01); *G05B 2219/45028* (2013.01); *G05B 2219/45031* (2013.01)

(58) Field of Classification Search
CPC ...................................................... G05B 19/19
See application file for complete search history.

(56) References Cited

U.S. PATENT DOCUMENTS

| | | | |
|---|---|---|---|
| 6,850,858 B1 * | 2/2005 | West | G03F 1/84 430/30 |
| 10,360,477 B2 | 7/2019 | Bhaskar et al. | |
| 2005/0095515 A1 | 5/2005 | Pellegrini | |
| 2009/0157343 A1 | 6/2009 | Kaushal et al. | |
| 2012/0029856 A1 | 2/2012 | Cohen et al. | |
| 2013/0035888 A1 * | 2/2013 | Kandel | G03F 7/70633 702/81 |

(Continued)

*Primary Examiner* — Suresh Suryawanshi
(74) *Attorney, Agent, or Firm* — Seed IP Law Group LLP

(57) ABSTRACT

The current disclosure describes techniques for managing vertical alignment or overlay in semiconductor manufacturing using machine learning. Alignments of interconnection features in a fan-out WLP process are evaluated and managed through the disclosed techniques. Big data and neural networks system are used to correlate the overlay error source factors with overlay metrology categories. The overlay error source factors include tool related overlay source factors, wafer or die related overlay source factors and processing context related overlay error source factors.

20 Claims, 8 Drawing Sheets

(56) References Cited

U.S. PATENT DOCUMENTS

2015/0067617 A1* 3/2015 Chang ................ G03F 7/70633
716/52
2016/0148850 A1 5/2016 David
2018/0350699 A1 12/2018 Gellineau et al.
2019/0368867 A1 12/2019 Da Costa Assafrao et al.

* cited by examiner

Error Source Data 124

- Tool Alignment 210
- Previous Tool Alignment 212
- Wafer Stage Position 214
- Step Position 216
- Reticle Key Position 218
- Exposure Position 220
- Wafer/Die Alignment 250
- Wafer Offset 252
- Wafer Rotation 254
- Die Offset 256
- Die Rotation 258

Context 280

- Depth Of Focus 282
- Exposure Time Duration 284
- Step Speed 286
- Illumination Setting 288
- Illumination Source 290
- EGA Position 292
- Field Position 294
- Metrology Position 296

FIG. 2

MACHINE LEARNING ON OVERLAY MANAGEMENT

BACKGROUND

With the evolving of semiconductor technologies, semiconductor dies are becoming increasingly smaller, while increasingly more functions are integrated into a single die. Accordingly, increasingly greater number of I/O pads need to be included in an integrated circuit ("IC") package together with smaller areas of die surfaces. Fan-out type wafer level packaging ("WLP") became a promising packaging technology to tackle this challenging scenario. In fan-out WLP, dies are severed from the original front-end wafers before they are positioned on a carrier wafer to package with connection wirings and I/O pads. In the fan-out WLP process, an advantage is that the I/O pads associated to a die can be redistributed to a greater area than the surface of the die itself. As such, the number of I/O pads packed together with a die can be increased.

The fan-out WLP package may be used to pack one die, multiple dies side-by-side or multiple dies in a package-on-package ("POP") vertical configuration. The POP configuration in fan-out WLP is achieved through interconnection features, such as a via, that connect multiple dies vertically.

Overlay metrology processes are used to monitor and control vertical alignments in various semiconductor manufacturing processes. An overlay metrology generally specifies how accurately a first patterned layer or a feature thereon aligns with respect to a second patterned layer disposed at a different vertical level from the first patterned layer, e.g., vertical alignment. An overlay error refers to a misalignment between a first part on the first patterned layer to a second part on the second patterned layer. An overlay error metrology, e.g., measurements, may be measured based on an offset between the first part and the second part or between an actual position of the first part and a target position of the first part. The target position may be determined based on advanced process control ("APC") in wafer processing.

In fan-out WLP, tested-good dies are positioned onto a carrier wafer. Layers of interconnection features are formed connecting the die to the associated I/O pads and among the various layers of interconnections themselves. The interconnections are formed through wafer level processes, where photoresist and photolithography processes are used similarly as in the front-end wafer fabrication processes. Therefore, vertical alignments between or among sequential layers of the interconnections need to be managed.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIG. 2 is an example error source data set.

DETAILED DESCRIPTION

Figure 1:
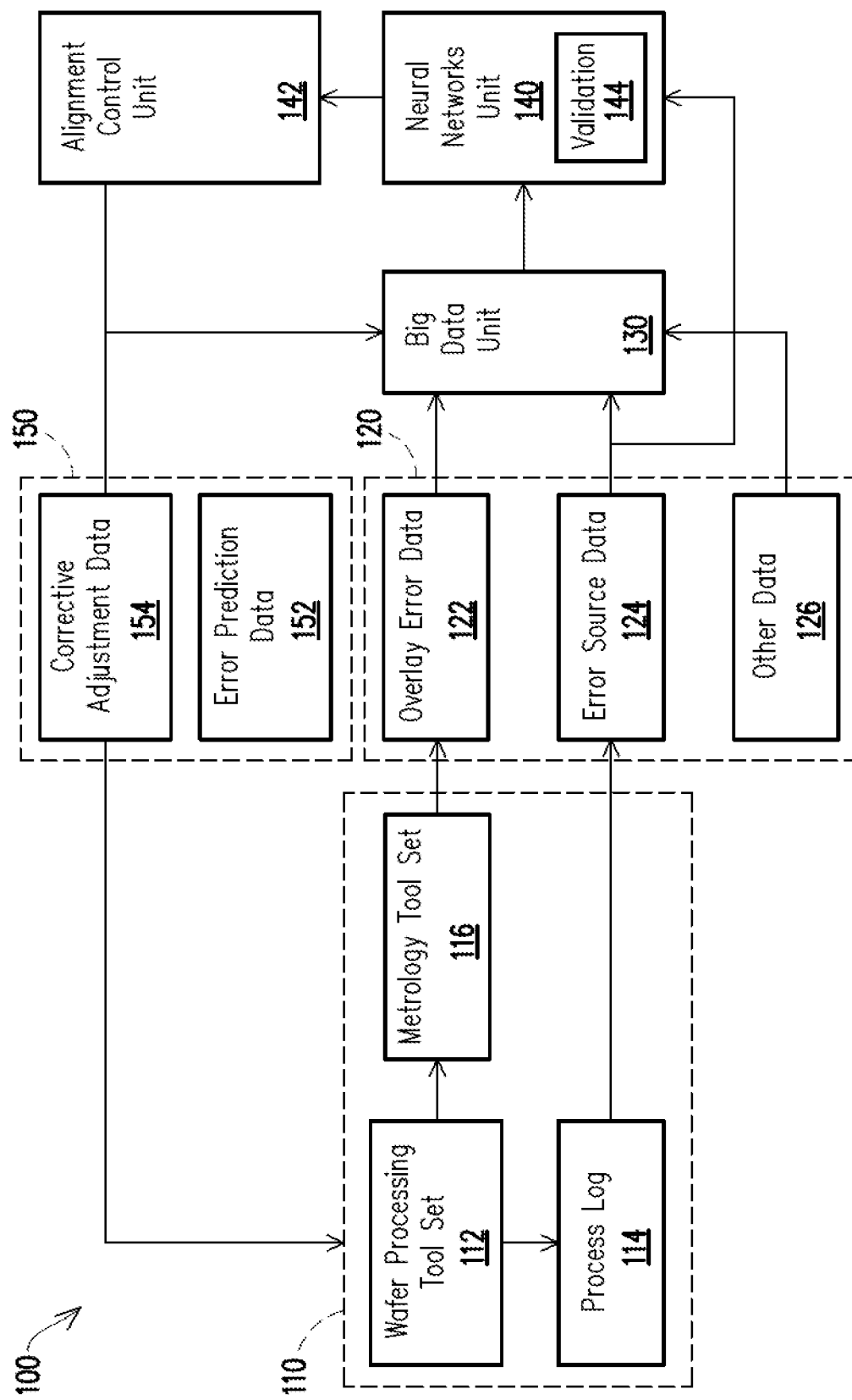
FIG. 1 is an example system for managing overlay alignment.

The current disclosure describes techniques for managing vertical alignment or overlay in semiconductor manufacturing using machine learning. For example, alignments of interconnection features in a fan-out WLP process are evaluated and managed through the disclosed techniques.

In an embodiment, big data and a neural networks system are used to correlate the overlay error source factors with overlay metrology categories. The overlay error source factors include tool related overlay source factors, wafer or die related overlay source factors and processing context related overlay error source factors. The tool related overlay source factors include, but are not limited to, light source position, reticle position, lens distortion, scan direction, the stepper position at exposure, or wafer stage position. The wafer or die related overlay error source factors include, but are not limited to, position offset or rotation of a wafer, position offset or rotation of a die on a wafer, a shape characteristic of a wafer like size deviation or thickness deviation, a shape characteristic of a die like shape deviation or thickness deviation. The processing context overlay error source factors include, but are not limited to, a global alignment region, e.g., a region on a wafer that is processed under global alignment control, global alignment positions, i.e., measurement positions on a wafer used for determining a global alignment adjustments in an enhanced global alignment ("EGA") control, a field alignment position, e.g., a position on a wafer that is processed under site-by-site or field-by-field alignment control, tool characteristics like wafer stage shape, exposition field position, e.g., a vertical position of the reticle which translates to a size of the exposure, a depth of focus, a exposure time duration, a step speed of the stepper tool, illumination source (white, green, ivory, or yellow light), other illumination settings, or a metrology position on measuring the overlay of layers. The overlay metrology information also is obtained. For example, the categories of the overlay errors include the sizes of the overlay error, e.g., in x-axis and y-axis, the rotation offset between the features, or the positions of the overlay errors, e.g., with respect to a wafer or with respect to a die. Those overlay metrology data are collected and fed into the machine learning.

A neural networks type machine learning technique is used to correlate the overlay error source factors with the overlay error metrology. A regression model function is obtained as a result of the machine learning. The data are continually updated and enhanced to continuously train the machine learning process and thus the regression model function. The regression model function may be used to predict or estimate an overlay metrology value on an interconnection layer formed in the fan-out WLP packaging process. A corrective adjustment to the tool alignment settings and/or the wafer alignment settings may be obtained based on the regression model function.

The regression model function may be validated in various approaches. For example, an estimated overlay metrology value may be compared with an actual metrology value of a reference wafer. The reference wafer may be a newly processed wafer or a previously processed wafer. The overlay error source data and actual metrology data of the reference wafer is determined or retrieved from database. The overlay error source data of the reference wafer are applied into the regression model function to estimate the overlay metrology values. The estimated overlay metrology values are compared with the actual metrology data to determine whether the estimation is sufficiently accurate. A threshold is used for the comparison. The threshold may be determined based on the overlay tolerance requirements of the features or layers of the wafer processing procedures. For example, in fan-out WLP, an threshold of about 0.1 μm may be chosen to determine whether an estimate overlay metrology value meets the actual metrology data of an interconnection feature over a die packaged in the fan-out WLP.

The regression model function may also be validated with respect to the estimated corrective adjustments. For example, an estimated corrective adjustment to the tool alignment or the wafer/die alignment may be implemented through a newly processed reference wafer. Overlay metrology is conducted on the reference wafer to determine whether overlay error is reduced or eliminated as estimated by the regression model function. A threshold may again be used.

Using the disclosed techniques, the effective capacity of the metrology tools are improved because of the AI-based overlay metrology. In an embodiment, the effective capacity of the physical metrology tools is improved by about 40 times. For example, using the disclosed virtual overlay metrology techniques, the processing capacity of the overlay metrology team has improved from 292 WLPs per day to about 11400 WLPs per day. The overlay metrology measurement accuracy is improved to a level of smaller than 0.1 μm. The processing cycle of overlay related quality control is substantially shortened from about 4 hours to substantially real time. As such the overall process cycle time of the fan-out WLP has also been improved, e.g., by 0.1 day of cycle time.

As the estimated overlay values are also compared with the actual overlay values in the cross-validation of the artificial intelligence function, the disclosed techniques can avoid model over-fitting problems.

In the disclosure herein, a stepper machine related overlay metrology process is used as an illustrative example to describe the disclosed techniques, which is not meant to limit the scope of the disclosure. The disclosed techniques can also be used to predict overlay metrology with respect to other bumping alignment tools in, e.g., die attach die shift metrology or ball mount stencil alignment metrology. Further, the disclosed virtual overlay metrology techniques may also be applied with respect to front-end semiconductor process alignment tools or processes.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is an example overlay management system 100. As shown in FIG. 1, the system 100 includes a wafer manufacturing on-site system 110, an input dataset 120, a big data unit 130, a neural networks unit 140, and an output dataset 150. The wafer manufacturing on-site system 110 includes a wafer processing tool set 112, e.g., a photolithography tool set 112, a process log 114 and a metrology tool set 116. The input dataset 120 includes overlay error data 122, error source data 124, and other data 126. Other data 126 may be historical data on wafer processing including historical overlay error data and historical error source data and other data on wafer processing in addition to or other than the wafer processing data obtained and maintained by the process log 114. The neural networks unit 140 may include or work together with an alignment control unit 142 and a validation unit 144. The output dataset 150 includes error prediction data 152 and corrective adjustment data 154 and other output data.

In operation, the wafer processing tool set 112 is configured to process a wafer, e.g., a carrier wafer with dice positioned thereon, in an example fan-out WLP process to form interconnection layers over the dice. The wafer processing tool set 112 may be a photolithography tool and include, for example, a stepper tool, e.g., a step and repeat camera, a wafer stage or chuck, and a gantry tool and other suitable tools. A stepper passes light through a reticle, forming an image of the reticle pattern. The image is focused and reduced by a lens, and projected onto the surface of a wafer that is coated with a photoresist. A stepper works in a step-and-repeat manner where the pattern on the reticle is exposed repeatedly across the surface of the wafer in a grid. The stepper moves a wafer through the wafer stage as a step from one shot location to another. The step movement of the wafer may be conducted back and forth and left and right with the grid under the lens of the stepper. In fan-out WLP, a gantry picks and positions a die onto a designated grid point or area on a carrier wafer. In some scenarios, more than one gantry tools are used to position dice onto a carrier wafer.

The process log 114 is configured to monitor, measure, determine and record wafer processing parameters related to the tool set 112 and the wafer positioned on the tool set 112 during the processing. Some or all of the wafer processing parameter data are identified as contributors or related to overlay errors and are consolidated into error source data 124.

After the wafer is processed by the photolithography tool set 112 for a layer or a feature on the layer, the metrology tool set 116 is configured to measure the wafer to determine whether an overlay error exists on the wafer with respect to the layer or the feature on the layer. The metrology data also includes details of an overlay error. The overlay error metrology details are categorized into the position of the overlay error on the wafer or one die, an offset dimension of the overlay error in x-axis, and/or y-axis, or a rotation in angle of the overlay. Some of the measurement results of the metrology tool set 116 are consolidated into the overlay error data 122. For the purposes of modeling the correlations between the error source factors and the overlay error categories, a zero-overlay error scenario is also useful and may be collected as part of the overlay error data 122.

The big data unit 130 is configured to collect the overlay error data 122, the error source data 124 and other data 126 and to combine or harmonize the various datasets for further analysis. For example, the big data unit 130 links the different data categories of the overlay error data 122, the overlay source data 124 and the other data 126 together in various ways with respect to a wafer layer, a location on a wafer layer, a structure on a wafer layer, multiple vertical structures that are designed to be vertically overlapping or other suitable linking approaches. In the description herein, a "feature" on a wafer is used to refer to any part of a wafer that links the overlay error data 122 and the error source data 124 together. For example, a feature on a wafer may be an interconnection structure. An overlay error data 122 entry is an overlay error of the interconnection structure and the linked error source data 124 entry is the wafer processing parameters recorded with respect to forming the interconnection structure.

The big data unit 130 also harmonizes the collected data regarding the measurement scale, measurement units, time scale, tolerance threshold, etc., such that the data entries are able to be used in a same analysis process. The big data unit 130 also enhances the collected data with respect to data entry missing and data entry interpolation. Other data processing, harmonization, or combination techniques are also possible and included within the big data unit 130.

The other data 126 may be historical data on overlay error data or error source data with respect to previously processed wafers. Such historical data are processed in a same or similar manner as the overlay error data 122 and the error source data 124 within the big data unit 130.

The neural networks unit 140 (or machine learning unit 140) is an artificial intelligence machine learning unit configured to conduct a supervised learning process using the data provided by the big data unit 130 to conclude a regression model function(s) correlating the overlay error source factors with the overlay error categories. The "supervision" component of the machine learning may be set to be relatively loose. For example, other than designating factors into the "input" category, e.g., the error source factors, and the "output" category, e.g., the overlay error categories, the neural networks unit 140 permits the neural networks engine to function "blindly" such as to maximize the advantages of machine learning in handling the data. Further, the neural networks unit 140 may be configured to conduct multiple different supervised learning tasks where the different groups of factors are categorized as the "input" or "output". For example, the overlay error metrology position, which is in the overlay error data 122, may be categorized as outputs in some learning tasks or may be categorized as inputs in other learning tasks. Different learning tasks may generate different regression model functions correlating the "input" factor(s) and the "output" factors.

In conducting the "supervised learning", the neural networks unit 140 may also differentiate between "systematic" error source factors and "random" error source factors. A "systematic" error source factor refers to a factor that tends to repeat a same data value or pattern in same or similar situations. A "random" error source factor refers to a factor that tends to have a random data value in same or similar situations or a factor whose data value is not controllable by the system 100. For example, a die positioning offset may be a systematic factor caused by a specific gantry tool. A stepper position offset may also be a systematic factor for a specific stepper machine. For another example, a die thickness variation or a die size variation may be a random factor which either happens randomly or is not controllable in the fan-out WLP process.

With the one or more regression model functions concluded through the supervised machine learning processes, the regression model function is used by the neural networks unit 140 to estimate or predict an overlay metrology on a wafer. In an embodiment, a backpropagation network is used to determine the regression model function that relates the input factors and the output factors. For example, in calculating the regression model functions, the inputs factors are "processed" by the "neutrons" to contribute to the output and the weights of the contributions of each of the "neutrons" are determined using the backpropagation algorithm.

The alignment control unit 142 is configured to use the regression model functions or the overlay estimation/prediction results to control the overlay alignment on wafer processing, e.g., the wafer processing of interconnections on fan-out WLP. Specifically, the alignment control unit 142 may apply processing log information of a wafer processing operation as inputs into the regression model functions to generate alignment control output data 150. The alignment control output data may then be used to control or adjust the wafer processing. For example, the alignment control output data 150 includes, among others, error prediction data 152 and corrective adjustment data 154. The error prediction data 152 indicates a predicted/estimated overlay metrology in one or more of wafer positions. The corrective adjustment data 154 indicates a change in one or more of the error source factors in the error source data 124 to eliminate an estimated/predicted overlay error.

In an embodiment, the alignment control unit 142 is part of the neural networks unit 140. In other embodiment, the alignment control unit 142 is a separate unit from the neural networks unit 140 and includes mechanisms to automatically adjust or cause to adjust one or more of the wafer processing tool setting or the wafer positions to eliminate overlay errors.

The validation module 144 of the neutral networks unit 140 is configured to validate the regression model functions based on metrology data obtained from a reference relevant wafer. A reference wafer may be a previously processed wafer whose overlay error data and error source data are readily available. A reference wafer may also be a new wafer under a wafer processing operation and is used, among others, for the validation purposes. For example, the estimated overlay metrology of the reference wafer, e.g., a position and a size of an estimated overlay error, is compared with an actual metrology measurement of the reference wafer. A threshold may be used to evaluate whether the overlay metrology estimate/prediction is sufficiently accurate or meet the actual metrology measurements. The comparison results may be used to further or continuously train and/or learn the corresponding regression model functions. For example, the training data sets of actually measured data on the overlay error source factors and the overlay errors are continually updated to reflect the newest status of the tools and the processes. In an embodiment, a fixed number of data entries in the training data sets are used to train the regression model functions. A newly measured data entry will substitute for the oldest data entry to maintain the fixed number. Similarly, a corrective adjustment data is basically a prediction of no overlay error for a reference wafer that is processed based on the corrective adjustment data. Actual metrology data of the reference wafer may be used to evaluate whether the corrective adjustment data effectively eliminates overlay error or not. Again, a threshold may be used in the evaluation. The threshold(s) may be chosen based on the design of the wafer or the wafer processing process. For a fan-out WLP process, the threshold may be chosen based on, e.g., the size of the interconnection features.

FIG. 2 shows an example error source data 124. The error source data 124 includes a sub-set 210 of tool alignment error source factors, a sub-set 250 of wafer/die alignment error source factors and a sub-set 280 of context error source factors. The tool alignment sub-set 210 includes data on the tool alignment parameters or settings that affect the overlay alignment. In an embodiment, the tool alignment sub-set 210 includes a previous tool alignment data 212, a wafer stage position data 214, a step position data 216, a reticle key position data 218, exposure position data 220 or other suitable tool alignment parameter data. The wafer/die alignment sub-set 250 includes data on the positions of a wafer on a wafer stage or a die on a wafer (in the fan-out WLP scenarios) that affects overlay alignment. In an embodiment, the wafer/die alignment sub-set 250 includes a wafer offset data 252, a wafer rotation data 254, a die offset data 256, a die rotation data 258 or other wafer/die alignment data. The context error source sub-set 280 includes the context information about the overlay metrology measurements. With the context information included, different types of wafer and different wafer processing parameters may be identified and considered in the neural networks processing. In an embodiment, regression model functions are separately determined or trained for different types of wafers and/or different wafer processing parameters. For example, different training data sets of overlay error source factors and overlay errors are maintained for each type of wafers and/or each set of wafer processing parameters. The different training data sets are updated separately to maintain the fixed number of data entries in each training data sets. In an embodiment, the context error source sub-set 280 includes depth of focus data 282, exposure time duration data 284, step speed data 286, illumination setting data 288, illumination source 290, enhanced global alignment ("EGA") position 292, field position data 294, metrology position data 296 or other suitable context data.

The previous tool alignment data 212 is the alignment positions of the wafer processing tool set 112 used for a previous wafer under the same wafer processing process as the current wafer, e.g., a wafer of the current data entry. The previous tool alignment data 212 is measured with respect to the same feature or process step as the current wafer and is measured with a same scale(s) as the current wafer. That is, the previous tool alignment data 212 is comparable to the current data entry. For example, in the scenario that the tool alignment data for the current wafer include the wafer stage position data 214, the step position data 216, the reticle key position data 218 and the exposure position data 220, the previous tool alignment data 212 include all the same data categories of the previous wafer.

The wafer stage position data 214 may be measured by the positions of the actuators that anchor the wafer stage. For example, a wafer stage may include three actuators for anchoring the x-axis, y-axis and z-axis positions of the wafer stage. The positions of the x-axis, y-axis, and z-axis actuators are recorded and logged to indicate the wafer stage positions.

The step position data 216 is the position of the stepper.

The reticle key position data 218 indicate the positions of the reticle that is anchored by the reticle keys.

The exposure position data 220 indicate a position or area on the wafer that is exposed to the illumination light.

The wafer stage position 214, step position 216, reticle key position 218 or exposure position 220 may be represented as locations in the x-axis, y-axis in the lateral plane and/or z-axis in the vertical plane. In some embodiments, the wafer stage position 214, step position 216, reticle key position 218 or exposure position 220 may each be represented as position errors to the respective target positions. In the measurement of position errors, an x-axis offset, an y-axis offset, and z-axis offset and a rotation error (in angle) may be used.

Note that for each of the tool alignment factors 214, 216, 218 and 220, one of more of three different types of data may be recorded and logged. A first type is the position data measured by a measurement device, e.g., a laser device, which is referred to as a "measured position". A second type is a position determined by an enhanced global alignment ("EGA") system of advanced process control ("APC") before an EGA adjustment is applied, which is referred to as a "pre-alignment position" or "pre-EGA position". A third type is a position determined after an EGA adjustment is applied, which is referred to as a "post-alignment position" or "post-EGA position". It should be appreciated that each one of the three types of the position data may deviate from the actual position of the tool sets 112. Such deviations in the tool set position determination may contribute to overlay errors. It is not necessary that all three types of the tool set alignment position data are used in the operations of the neural networks unit 140. The neural networks unit 140 may choose to use some types of the data in some regression models and use other types of the data in other regression models. Further, it is not necessary that all three types of data are included in the error source data 124. In some operations scenarios, the EGA is not conducted and the pre-EGA and the post-EGA position data types are not available. In some other scenarios, the measured position data type is not available or not included in the error source data 124.

These three types of tool alignment data, e.g., measured position, pre-EGA position, post-EGA position, may be related to one another. For example, the post-EGA position is obtained based on the pre-EGA position. However, in obtaining each of the three types, additional or different factors are introduced, which may contribute to the possible deviations. For example, the EGA may be affected by the selected EGA measurement points on the wafer to determine the EGA adjustment, which are referred to as "EGA positions". As such, by including one or more of the three types of position data in the tool alignment sub-set 210, the neural networks unit 140 can achieve a regression model function that more validly reflects or considers the correlations between the tool alignment factors and the overlay metrology categories.

Other ways to determine the tool alignment is also possible and included in the disclosure.

In the wafer/die alignment sub-set 250, the wafer offset data 252 indicates an offset amount of a wafer on the wafer stage. The wafer offset includes offset in x-axis and offset in y-axis. In an embodiment, the wafer offset is determined through wafer alignment marks included on a wafer, or other suitable mechanisms.

The wafer rotation data 254 indicates an angle of rotation of a wafer on the wafer stage. In an embodiment, the wafer rotation is determined through wafer alignment marks or other suitable mechanisms.

The die offset data 256 indicates an offset amount of a die on a carrier wafer. The die offset includes x-axis offset and y-axis offset. In an embodiment, the die offset is determined through die alignment marks included on a die, or other suitable mechanisms.

The die rotation data 258 indicates an angle of rotation of a die on a carrier wafer. In an embodiment, the die rotation is determined through die alignment marks or other suitable mechanisms.

Similarly with the tool alignment sub-set 210, data categories in the wafer/die alignment sub-set 250 may also include three types of data, e.g., measured position, pre-EGA position, and post-EGA position. Note that the EGA system for the die alignment may be different from the EGA system for the wafer alignment.

The measured position, pre-EGA position, post-EGA position are provided as examples of data types for the alignment position data categories. These examples are not meant to limit the scope of the disclosure. Other data types are also possible for the alignment position data categories, which are all included in the disclosure. For example, field alignment of a wafer or a die is also possible and the tool/wafer/die positions before and after the field alignment operations may be used in the error source data 124.

The depth of focus data 282, exposure time duration data 284, illumination setting data 288, illumination source data 290 are self-descriptive. The step speed data 286 indicates the moving speed of the stepper. These data are basically parameters in the process recipe and are used to identify the context of the overlay metrology and the overlay errors, if any. By incorporating such context data, the regression model functions generated by the neural networks unit 140 could be further enhanced, e.g., by eliminating the complexities caused by the various context factors. That is, regression models functions may be trained or determined for each one of the context variables.

The EGA position data 292 indicates the multiple location points on a wafer/die identified for the EGA alignment purposes. Various features on a wafer generally include varied shapes and profiles. As such, the choices of the EGA positions, e.g., the features on the EGA positions, lead to varied EGA assessment and adjustment outcomes.

The field position data 294 indicate a size of the wafer/die area illuminated in the photolithography process. In an embodiment, the field position data 294 is measured through a size of the reticle opening and a distance between the reticle and the wafer surface.

The metrology position 296 indicates the position on a wafer or on a die where an overlay metrology is measured. As described herein, the metrology position on a wafer may serve one or more of as an error source factor or as an overlay error category. As an error source factor, the position of metrology measurement on a wafer affects whether an overlay error exists or is detectable.

It should be appreciated that the example error source data categories listed in FIG. 2 are examples and do not limit the scope of the disclosure. Other factors that contribute to the occurrence and/or size of an overlay error may also be used and included in the error source data 124, which are all included in the disclosure.

Figure 3:
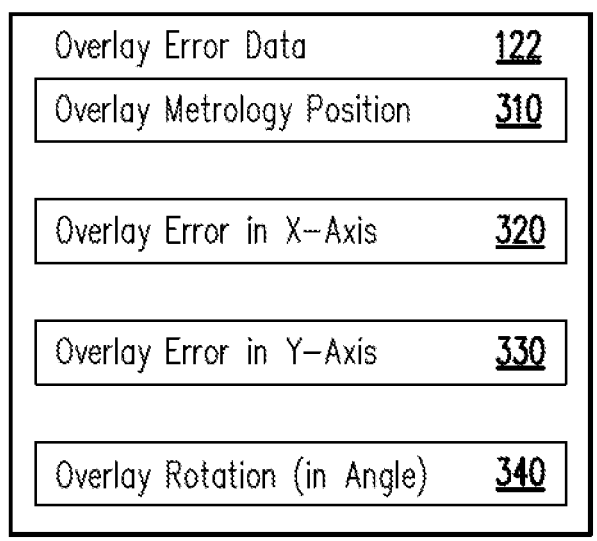
FIG. 3 is an example overlay error data set.

FIG. 3 shows an example overlay error data 122. As shown in FIG. 3, the overlay error data 122 includes four overlay error categories, an overlay metrology position data 310, an overlay error in x-axis data 320, and overlay error in y-axis data 330 and an overlay rotation (in angle) data 340. The overlay metrology position data 310 indicates where, on a wafer or on a die, an overlay error occurs/is detected. The overlay error in x-axis data 320 and the overlay error in y-axis data 330 indicate the size of an overlay error in the x-axis or the y-axis, respectively. The overlay rotation (in angle) data 340 indicates an overlay error where the actual metrology of a feature deviates from the target metrology by an angle.

Various approaches may be used to define an overlay error. In an embodiment, an overlay error is determined based on an actual metrology and a target metrology of a feature. In another embodiment, an overlay error is determined based on the alignment between an upper feature and a lower feature. Other approaches to determine overlay alignment accuracy or an overlay error are also possible and included in the disclosure.

Figure 4:
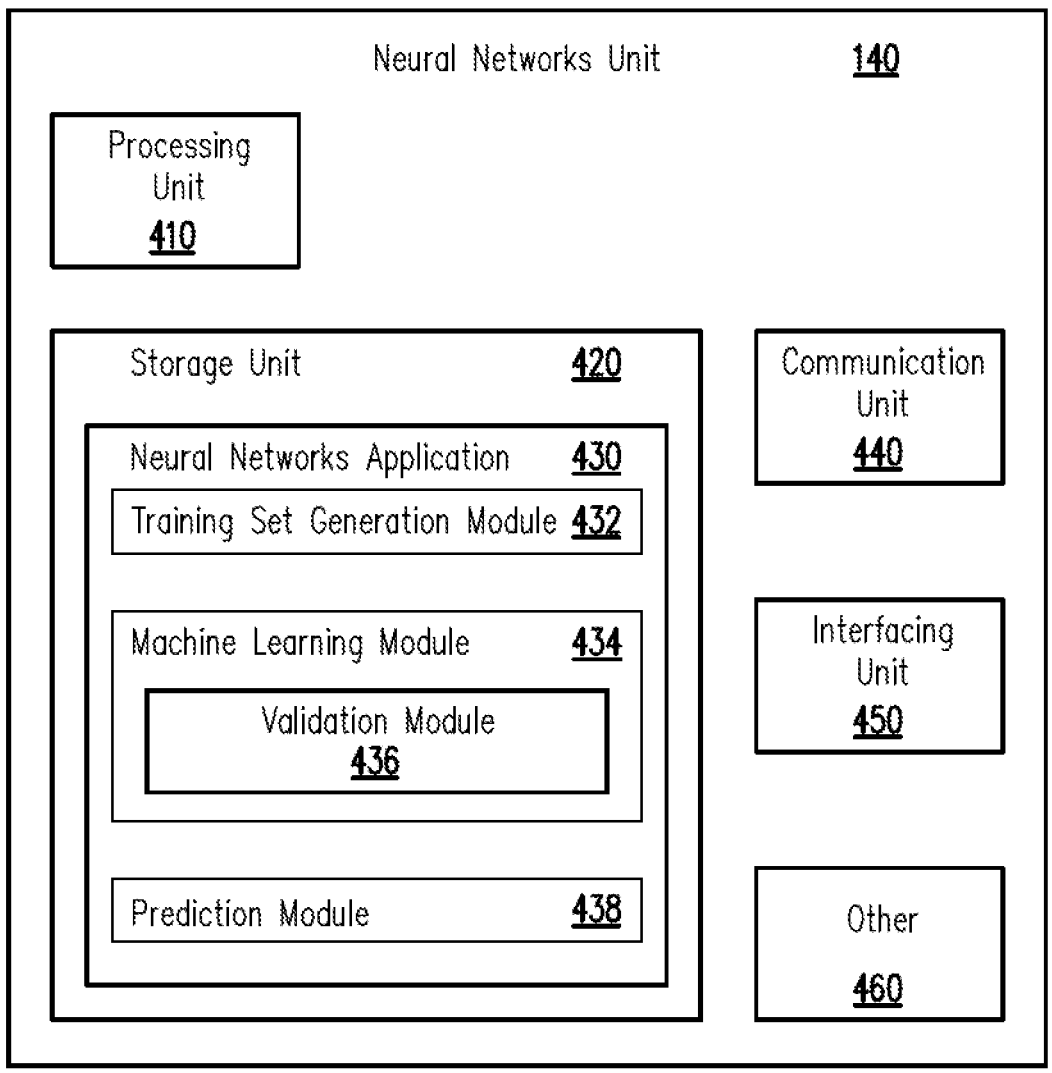
FIG. 4 is an example neural networks system.

FIG. 4 shows an example neural networks unit 140. Referring to FIG. 4, the neural networks unit 140 includes an processing unit 410, e.g., a computer processor or a processing capacity allocated to the neural networks unit 140 in a virtual machine application, a storage unit 420 having a neural networks application 430 stored thereon, a communication unit 440 configured to communicate with other computers or machines linked to the neural networks unit 140 in a distributed computing environments, an interfacing unit 450 configured for inputs, outputs and user interactions, and other components 460.

The neural networks application 430 includes executable instructions which, when executed by the processing unit 410, configure the processing unit 410 to implement a training set generation module 432, a machine learning module 434 including a validation module 436, and a prediction module 438. In an embodiment, the executable instructions dedicated for implementing the training set generation module 432, the machine learning module 434, and the prediction module 438 are stored on the storage unit 420 in separate dedicated spaces of the storage unit 420 or in a separable/parsable manner such that executable instructions for these modules are easily identified through parsing or indexing.

One or more of the components of the neural networks unit 140 may be achieved through physical devices, e.g., a server computer, or through virtual devices in a distributed computing environment. For example, multiple host servers may be linked to a wafer processing site/operation. The host servers may function together in a distributed computing scheme to support one or more virtual layers where the neural networks unit 140 and/or the big data unit 130 reside. The virtual layers may be any level of virtualization, e.g., total virtualization, OS level virtualization, application level virtualization or some other levels of partial virtualizations.

Further, it is not necessary that the components of the neural networks unit 140 reside in a same level of virtualization. It is possible that some of the components of the neural networks unit 140 are implemented through physical layers, some through various levels of the virtual layers, which are all included in the disclosure.

Figure 5:
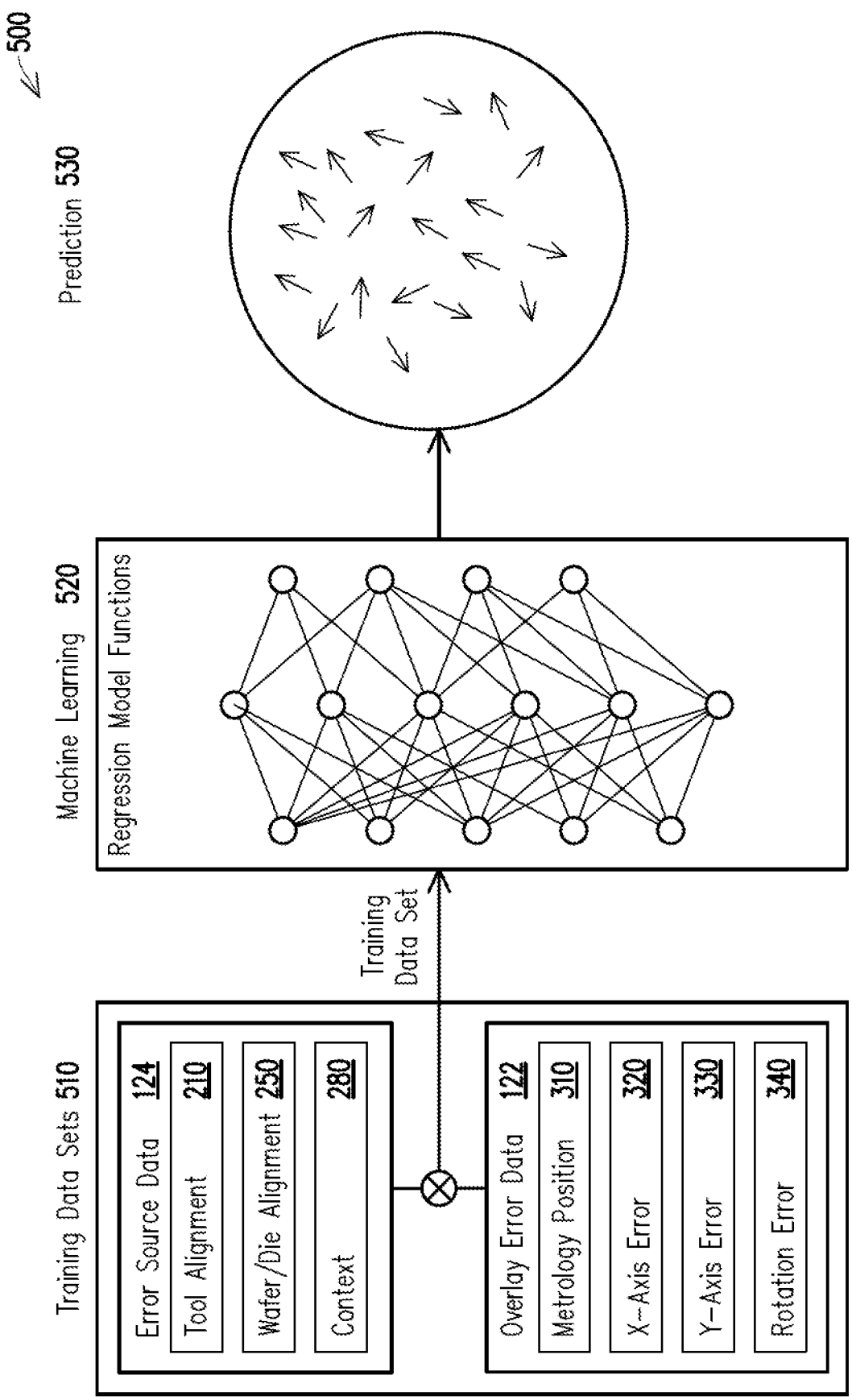
FIG. 5 is an example operation of the neural networks system.

FIG. 5 shows an operation structure 500 of the neural networks application 420. The training set generation module 432 is configured to receive data from the big data unit 130 and generate, in operation 510, training data sets. For example, the error source data 124 and the overlay error data 122 are received and processed to generate the training data sets to train the machine learning operation 520. The training data sets are continually updated with new data entries added and old data entries eliminated. In an embodiment of the operation 510, the training set generation module 432 processes the received data sets through a pre-training process to optimize the data sets for the purpose of the machine learning process 520.

In an embodiment, in the machine learning operation 520, the machine learning module 434 conducts a supervised training process using the training data sets. The supervised training specifically defines data objects categorized as inputs and data objects categorized as outputs in the training data sets and pair the input data objects with the respective output data objects. Then the pairs of input and output data entries are analyzed to generate regression model functions through training connections between or among neurons. In an embodiment, the overlay source factors are categorized as inputs ("x") and the overlay metrology errors are categorized as outputs ("y"). The resultant regression model functions each links one or more of the error source factors to one overlay error category, e.g., overlay metrology position, overlay error in x-axis, overlay error in y-axis and an overlay rotation.

In prediction operation 530, the prediction module 438 uses the generated regression model functions to predict or estimate an overlay metrology on a wafer under a wafer processing operation. Specifically, the wafer processing parameters are obtained from the processing log 114 as inputs and applied into the regression model functions to generate the overlay metrology information as an output. The prediction module 438 may also predict a corrective adjustment(s) on the wafer processing parameters, e.g., on one or more of the tool alignment settings and/or the wafer/die alignment factors, to eliminate or mitigate an estimated/predicted overlay error.

As shown in FIG. 5, the prediction of the overlay errors may be conducted for a whole wafer. Within the wafer, the overlay errors may follow a consistent pattern or may vary between/among different fields on the wafer. With the stepper devices used in the wafer processing, it is possible to adjust the wafer processing settings to specifically correct the overlay errors on an individual field on the wafer. However, there are scenarios that overlay errors on two or more fields on the wafer cannot be individually corrected and are interrelated under the wafer processing operations. A decision making operation may be conducted to determine an overall corrective adjustment(s) of the wafer processing operation to balance between/among with the two or more fields on overlay alignment.

The results of the prediction operation 530 are output to the alignment control unit 142 to control the wafer processing operation accordingly. For example, the error prediction data 152 may be used to manually adjust the wafer processing parameter settings to avoid or reduce the overlay error problem. The corrective adjustment data 154 may be readily used by an operator or a machine to automatically adjust the wafer processing parameter settings to avoid or reduce the overlay alignment issue. The adjusted processing parameters and the related overlay metrology data again are fed into the neural networks unit 140 to further train or refine the regression model functions because they together represent a new data entry. That is, the machine learning process in the neural networks unit 140 may be configured to be a dynamic process, which continuously updates the regression model functions that correlate the error source factors with the overlay error categories.

The validation module 436 is configured to evaluate whether a generated regression model function accurately represents the correlations between the error source factors and the overlay error categories. For example, the predicted overlay metrology values may be compared with the actual metrology measurements. A threshold may be used to determine whether the estimated/predicted overlay metrology meets the actual overlay metrology data. For example, in fan-out WLP wafer processing operations, a threshold of 0.1 μm may be used to determine whether an estimated overlay error meets the actual overlay metrology.

Figure 6:
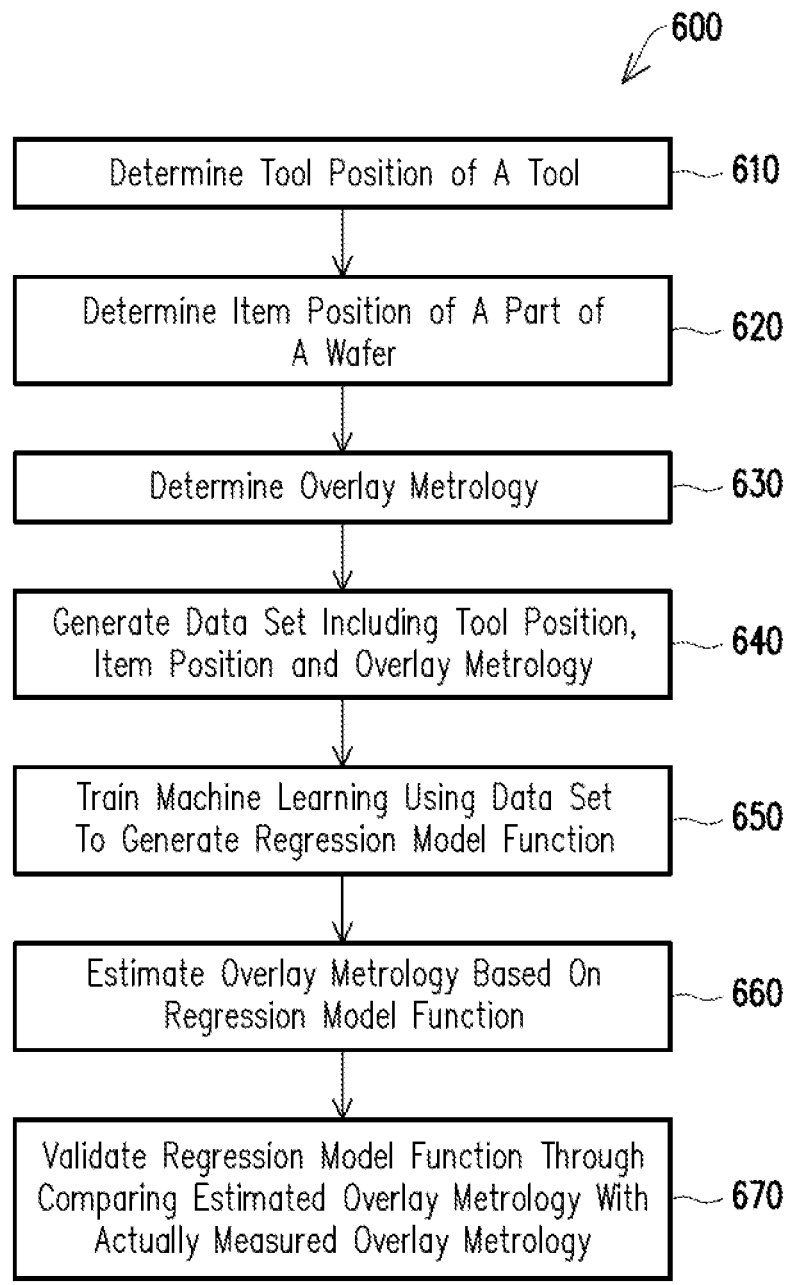
FIG. 6 is an example process of overlay alignment management.

FIG. 6 is a flow diagram of an example operation process 600. In example operation 610, the process log 114 determines a tool position of a wafer processing tool, e.g., a stepper, with respect to forming an interconnection feature on a wafer. The tool position may be one or more of a measured position, a pre-alignment position or a post alignment position.

In example operation 620, the process log 114 determines a position of a portion of the wafer corresponding to the feature on the wafer, referred to as "item position" for descriptive purposes. The item position may be one or more of a measured position, a pre-alignment position or a post alignment position.

Figure 7:
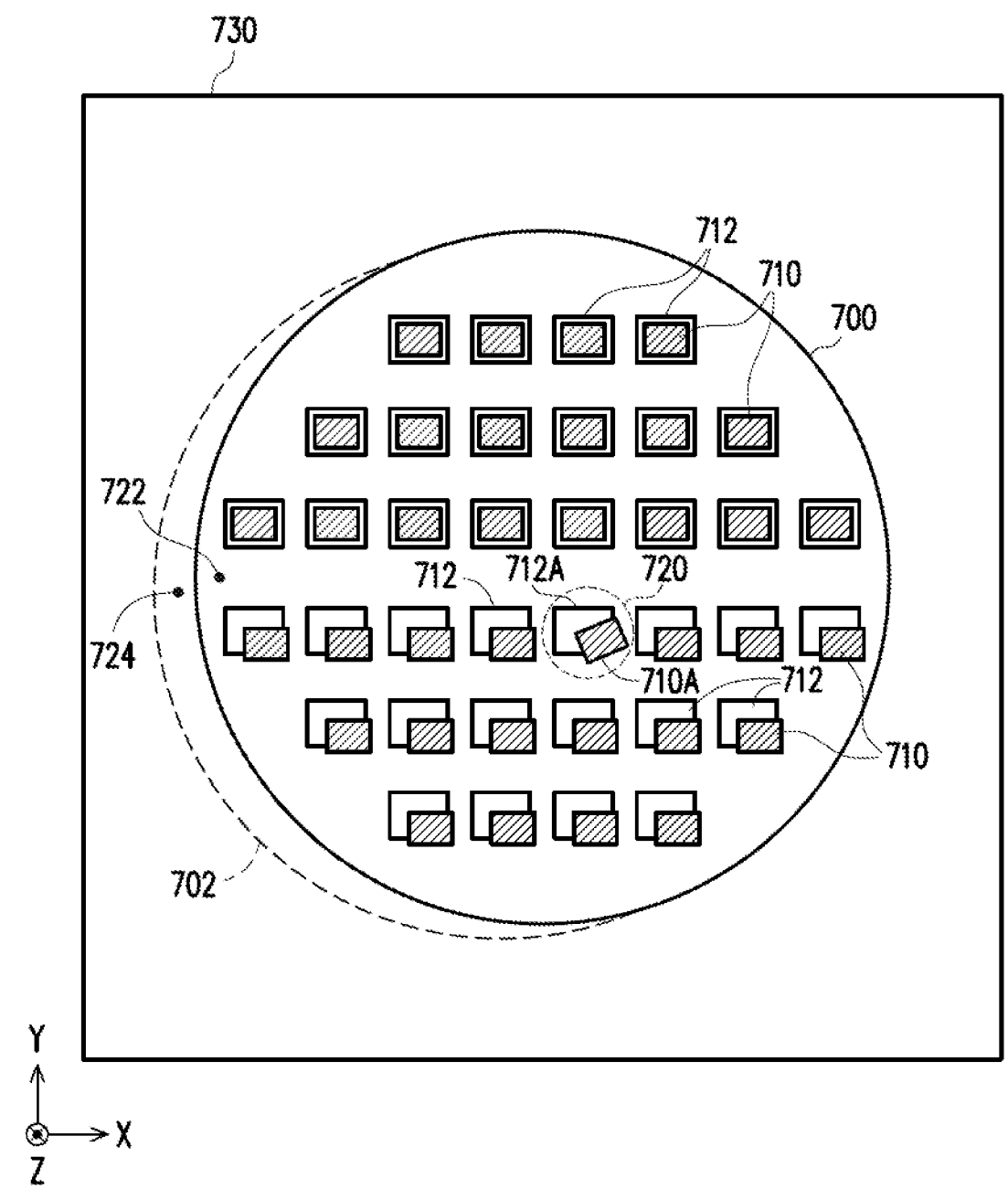
FIG. 7 is an example carrier wafer with dice positioned thereon in an fan-out wafer level packaging process.

FIG. 7 illustrates, as an example, a carry wafer 700 with multiple dice 710 positioned on the wafer 700. The process log may determine an item position of a portion 720 (shown in dotted circle) of the wafer 700, which corresponds to the interconnection feature. As shown in FIG. 7 as an illustrative example, the portion 720 includes a die 710A position on the wafer 700 in a fan-out WLP process. The item position of the portion 720 may be measured in multiple ways. For example, the item position of the portion 720 may include a wafer offset in x-axis and/or in y-axis indicated as the misalignment between the alignment mark 722 on the wafer 700 and the alignment mark 724 on the wafer stage 730. The item position may also include a rotation between the wafer 700 and a target wafer position 732 on the wafer stage 730 (shown as dotted circle).

Further the item position may also include a die offset in x-axis and/or in y-axis. As shown in FIG. 7 as an illustrative example, the dice 710 positioned on the lower portion of the carrier wafer 700 all include alignment offset with respect to the target position 712. Such alignment offset may be systematically caused by a problematic gantry tool dedicated for picking up and positioning dice 710 on the lower portion of the wafer 700. As illustratively shown with respect to the portion 712, the corresponding die 710A may also include a rotation error with respect to the target position 712A.

The wafer alignment position and the die alignment position together may be determined by the process log 114.

Figure 8:
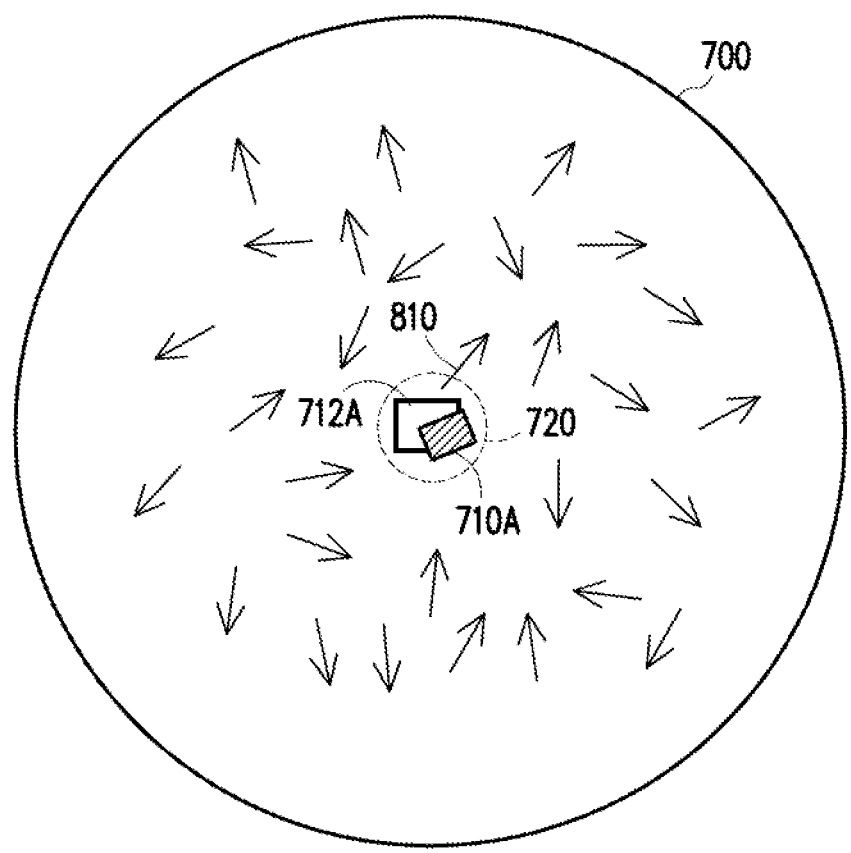
FIG. 8 is an example overlay metrology on the wafer of FIG. 7.

In example operation 630, the metrology tool set 116 determines an overlay metrology with respect to the interconnection feature. FIG. 8 shows an illustrative example of an overlay metrology measurement of wafer 700. As shown by FIG. 8, the overlay alignment metrology on different portions of the wafer 700 may be different and may not be consistent. The metrology data 810 for the interconnection feature on the portion 720 are identified as related to the tool position information and the item position information. That is, those data may be linked together through the interconnection feature.

In example operation 640, the training set generation module 432 generates a data set including the tool position data, the item position data and the overlay metrology data with respect to the interconnection feature over the portion 720 of the wafer 700.

In example operation 650, the machine learning module 434 generates a regression model function through machine learning that is trained by the training data set. In an embodiment, the training data set is used by the machine learning module 434 to set up the parameters of the regression functions linking the input data, e.g., the wafer alignment data and the die alignment data, with the output data, e.g., the overlay metrology data. The training may be continuously repeated and updated as new datasets are added into the training dataset which replace older datasets. The new data sets will reflect the updated status of the fabrication process where the overlay metrology errors are generated. It should be appreciated that the generated data set may be one of many data set entries to train the machine learning process. The regression model functions may already exist in the machine learning module 434 and may be continuously trained and/or enhanced with new training data sets. The regression model may also be newly created by the machine learning module 434.

In example operation 660, the prediction module 438 estimates an overlay metrology on a second wafer based on the trained regression model function. For example, the tool position, item position with respect to the second wafer may be applied to the regression model function to estimate the overlay metrology.

In example operation 670, the validation module 436 evaluates the regression model function through comparing the estimated metrology with actually measured metrology on the second wafer.

The techniques are described with fan-out WLP processes as an example. It should be appreciated that the techniques are similarly applicable to front-end wafer processing and other back-end wafer processing operations.

The present disclosure may be further appreciated with the description of the following embodiments:

In a method embodiment, a tool position of a wafer processing tool is determined. The wafer processing tool is used to form a first feature on a first wafer. An item position of a first portion of the first wafer is determined. The first portion corresponds to the first feature. An overlay metrology is determined with respect to the first feature. A data set is generated which includes the tool position, the item position and the overlay metrology. A function is generated which correlate one or more of the tool position or the item position on a first side of the function with the overlay metrology on a second side of the function. The function is generated through machine learning using the data set.

In another embodiment, a system includes a wafer processing tool configured to form a feature on a wafer, a metrology tool configured to measure an overlay alignment of the feature on the wafer, an overlay modeling tool configured to generate an estimated overlay alignment metrology of the feature based on one or more of an alignment parameter of the wafer processing tool or an alignment parameter of the wafer, and a process control tool configured to adjust one or more of the alignment parameter of the wafer processing tool or the alignment parameter of the wafer based on the estimated overlay alignment metrology.

A computing system includes a processor and a storage unit having executable instructions stored thereon. When the executable instructions are executed by the processor, the executable instructions configures the processor to implement various actions including: receiving data on a tool position of a wafer processing tool with respect to forming a first feature on a first wafer, receiving data on an item position of a position of the first wafer on a wafer holding tool with respect to the forming the first feature on the first wafer, receiving data on a context with respect to the forming the first feature on the first wafer; and generating a data for adjusting one or more of the tool position or the item position based on applying at least one of the tool position data, the item position data and the context data into a regression model function that correlates at least one of the tool position data, the item position data and the context data with an overlay metrology of the first feature on the first wafer.

The various embodiments described above can be combined to provide further embodiments. All of the U.S. patents, U.S. patent application publications, U.S. patent applications, foreign patents, foreign patent applications and nonpatent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   receiving, by a computing device, a data set including a first tool position of a tool with respect to forming a first feature on a first wafer, a first item position of a first portion of the first wafer corresponding to the forming the first feature, and a first overlay metrology of the first feature formed on the first wafer;
   generating, by the computing device, a function correlating one or more of a tool position or an item position on a first side of the function with an overlay metrology on a second side of the function through machine learning based on the data set;

receiving, by the computing device, a second tool position of the tool with respect to forming a second feature on a second wafer and a second item position of a second portion of the second wafer corresponding to the forming the second feature;

estimating, by the computing device, a second overlay metrology of the second feature on the second wafer based on the function, the second tool position and the second item position; and adjusting, by a controller coupled to the computing system, one or more of the second tool position or the second item position in a semiconductor manufacturing process of forming the second feature on the second wafer based on the estimated second overlay metrology.

2. The method of claim 1, wherein each of the first or second tool position includes one or more of a wafer stage position, a stepper position, a reticle key position or an exposure position.

3. The method of claim 1, wherein each of the first or second item position includes one or more of a wafer offset or a wafer rotation of the first wafer positioned on a wafer stage.

4. The method of claim 3, wherein each of the first or second item position further includes one or more of a die offset or a die rotation of a die positioned on the first portion of the first wafer.

5. The method of claim 1, wherein each of the first or second tool position includes one or more of a measured position, a pre-alignment position and a post-alignment position.

6. The method of claim 1, wherein each of the first or second item position includes one or more of a measured position, a pre-alignment position and a post-alignment position.

7. The method of claim 1, further comprising:
determining a context of forming the first feature on the first wafer; and
generating the data set including the context.

8. The method of claim 7, wherein the context includes one or more of a measurement position of an enhanced global alignment operation on the first wafer, an exposure field with respect to forming the first feature, and a metrology position on the first wafer where the overlay metrology is measured.

9. The method of claim 1, further comprising:
determining a previous tool position of the tool with respect to forming a first feature on a previous first wafer; and
generating the data set including the previous tool position.

10. The method of claim 1, wherein the generating the function includes generating the function using machine learning through a neural networks system.

11. The method of claim 1, further comprising evaluating the function through comparing the estimated overlay metrology of the second wafer with a measured overlay metrology of the second wafer.

12. An non-transitory storage medium having executable instructions stored thereon, which when executed by a processor enable the processor to implement acts comprising:
receiving a data set including a first tool position of a tool with respect to forming a first feature on a first wafer, a first item position of a first portion of the first wafer corresponding to the forming the first feature, and a first overlay metrology of the first feature formed on the first wafer;

generating a function correlating one or more of a tool position or an item position on a first side of the function with an overlay metrology on a second side of the function through machine learning based on the data set;

receiving a second tool position of the tool with respect to forming a second feature on a second wafer and a second item position of a second portion of the second wafer corresponding to the forming the second feature;

estimating a second overlay metrology of the second feature on the second wafer based on the function, the second tool position and the second item position; and adjusting one or more of the second tool position or the second item position based on the estimated second overlay metrology.

13. The storage medium of claim 12, wherein each of the first or second tool position includes one or more of a wafer stage position, a stepper position, a reticle key position or an exposure position.

14. The storage medium of claim 12, wherein each of the first or second item position includes one or more of a wafer offset or a wafer rotation of the first wafer positioned on a wafer stage.

15. The storage medium of claim 14, wherein each of the first or second item position further includes one or more of a die offset or a die rotation of a die positioned on the first portion of the first wafer.

16. The storage medium of claim 12, wherein the acts include:
determining a previous tool position of the tool with respect to forming a first feature on a previous first wafer; and
generating the data set including the previous tool position.

17. A computing system, comprising:
a processor; and
a storage unit having executable instructions stored thereon which, when executed by the processor, configures the processor to implement actions including:
receiving a data set including a first tool position of a tool with respect to forming a first feature on a first wafer, a first item position of a first portion of the first wafer corresponding to the forming the first feature, and a first overlay metrology of the first feature formed on the first wafer;

generating a function correlating one or more of a tool position or an item position on a first side of the function with an overlay metrology on a second side of the function through machine learning based on the data set;

receiving a second tool position of the tool with respect to forming a second feature on a second wafer and a second item position of a second portion of the second wafer corresponding to the forming the second feature;

estimating a second overlay metrology of the second feature on the second wafer based on the function, the second tool position and the second item position; and adjusting one or more of the second tool position or the second item position based on the estimated second overlay metrology.

18. The computing system of claim 17, wherein each of the first or second tool position includes one or more of a wafer stage position, a stepper position, a reticle key position or an exposure position.

19. The computing system of claim 17, wherein each of the first or second item position includes one or more of a wafer offset or a wafer rotation of the first wafer positioned on a wafer stage.

20. The computing system of claim 17, wherein each of the first or second tool position includes one or more of a measured position, a pre-alignment position and a post-alignment position.

* * * * *